(12) United States Patent
Abouda et al.

(10) Patent No.: US 12,081,205 B2
(45) Date of Patent: Sep. 3, 2024

(54) PULL UP AND PULLDOWN STABILISER CIRCUITS AND METHODS FOR GATE DRIVERS

(71) Applicant: NXP USA, INC., Austin, TX (US)

(72) Inventors: Pascal Kamel Abouda, Saint Lys (FR); Badr Guendouz, Colomiers (FR); Nicolas Roger Michel Claude Baptistat, Toulouse (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 18/180,450

(22) Filed: Mar. 8, 2023

(65) Prior Publication Data
US 2023/0299765 A1    Sep. 21, 2023

(30) Foreign Application Priority Data

Mar. 16, 2022   (EP) ..................................... 22305308

(51) Int. Cl.
*H03K 17/16*    (2006.01)
(52) U.S. Cl.
CPC ................................. *H03K 17/162* (2013.01)
(58) Field of Classification Search
CPC ..................................................... H03K 17/162
USPC ......................................................... 327/109
See application file for complete search history.

(56) References Cited

U.S. PATENT DOCUMENTS

| | | | | |
|---|---|---|---|---|
| 6,060,938 A | * | 5/2000 | Morrill | H03K 19/00361 326/27 |
| 2009/0278589 A1 | * | 11/2009 | Nishimura | H03K 17/163 327/394 |
| 2021/0359674 A1 | * | 11/2021 | Keskar | H03K 17/04206 |

FOREIGN PATENT DOCUMENTS

KR    20220021760 A1    2/2022

* cited by examiner

Primary Examiner — Tomi Skibinski

(57) ABSTRACT

Stabiliser circuits and methods are disclosed, for stabilizing a voltage at a gate driver terminal of a gate-driver for a driven transistor to a one of a high voltage and a low voltage, the stabilizer circuit comprising: a first transistor and a second transistor having respective first and second main terminals and connected in series between the gate voltage terminal and a first reference voltage terminal; and a low-pass filter connected between a control terminal of the first transistor and the gate driver terminal; wherein the first transistor is configured to have a threshold voltage which is less that a threshold voltage of the driven transistor; and the second transistor has a control terminal which is configured to be connected to a voltage which is an oppositive of the voltage at the gate driver terminal.

18 Claims, 4 Drawing Sheets

PULL UP AND PULLDOWN STABILISER CIRCUITS AND METHODS FOR GATE DRIVERS

CROSS-REFERENCE TO RELATED APPLICATIONS

This application claims the priority under 35 U.S.C. § 119 of European Patent application no. 22305308.3, filed on 16 Mar. 2022, the contents of which are incorporated by reference herein.

FIELD

The present disclosure relates to stabiliser circuits, and in particular to stabiliser circuits for stabilising a voltage at the gate of a transistor, for instance in association with gate driver circuits. Such circuits may be either pull-up circuits or pulldown circuits.

BACKGROUND

In some applications, noise, transients or interference can result in a voltage on a digital signal line differing from the intended voltage (for instance a design "high" or "low"). Although generally noise or other interference would tend to cancel out over time, in some circumstances, the noise or interference may be partially, or completely, rectified by other circuit elements, resulting in the potential for a drift over time from the intended voltage. In two-level logic systems, the drift may even be enough to trigger a logical shift from "high" to "low" or vice versa. The problem may be particularly severe in noisy environments such as in automotive electronics. One, non-limiting, example of an application in such a noisy environment is that of battery management systems for controlling and managing the power source for electric vehicles. Various "clamping" circuits are known in order to reduce the drift; however there remains an ongoing need for simple or improved clamping circuits.

SUMMARY

According to one aspect of the present disclosure, there is provided a stabilizer circuit, for stabilizing a voltage at a gate driver terminal of a gate-driver for a driven transistor to a one of a high voltage and a low voltage, the stabilizer circuit comprising: a first transistor and a second transistor having respective first and second main terminals and connected in series between the gate voltage terminal and a first reference voltage terminal; and a low-pass filter connected between a control terminal of the first transistor and the gate driver terminal; wherein the first transistor is configured to have a threshold voltage which is less than a threshold voltage of the driven transistor; and the second transistor has a control terminal which is configured to be connected to a voltage which is an oppositive of the voltage at the gate driver terminal. By providing a path to local ground which switches on at a lower voltage than would be required to turn on the driven transistor, the possibility of an undesirable turn-on of the driven transistor resulting from cumulative effects of noise which might tend to increase the voltage at the input terminal may be reduced or even eliminated, in the case of tying to the lower voltage; conversely, the possibility of an undesirable turn-off of the driven transistor resulting from cumulative effects of noise which might tend to decrease the voltage at the input terminal may similarly be reduced or even eliminated by tying the voltage to a higher voltage.

In one or more embodiments, the first transistor has a first transistor first main terminal connected to a reference voltage terminal, and a first transistor second main terminal; and the second transistor has a second transistor first main terminal connected to the first transistor second main terminal, and a second transistor second main terminal connected to the gate driver terminal.

In one or more embodiments the first transistor has a body contact configured to be connected to a second reference voltage through a biasing resistor such that the threshold voltage of the first transistor is less than a threshold voltage of the driven transistor. The high voltage may be in a range between 3V and 7V, and the low voltage be a ground voltage. In other applications or other embodiments, different ranges of values may be applicable for the high voltage.

The voltage at the gate driver terminal may be the low voltage and the control terminal of the second transistor correspondingly may be configured to be connected to the high voltage; the second reference voltage may be higher than a threshold voltage of the driven transistor (Vth). Such embodiments may in particular stabilise the gate voltage when the input voltage is low and act as a "pull-down" circuit.

In one or more embodiments the first transistor is an NMOS transistor; in other embodiments other transistor types may be used. Similarly, in one or more embodiments the second transistor is an NMOS transistor, but in other embodiments other transistor types may be used.

The first transistor may have a gate width to gate length ratio of at least 25. The first reference voltage and the biasing resistor may be configured such that a voltage difference between the first transistor body terminal and the first transistor first main terminal is in a range between 0.5V and 1.5V. The low-pass filter may have a cut-off frequency which is no more than one-fifth of an operational frequency of the gate-driver.

According to another aspect of the present disclosure, there is provided a stabilizer circuit for stabilizing a gate voltage at a gate driver terminal of a driven transistor to a one of a high voltage and a low voltage, the stabilizer circuit comprising: a first transistor, having a first transistor first main terminal connected to a reference voltage terminal, a first transistor second main terminal, a first transistor control terminal, and a body terminal connected to a second reference voltage terminal; a second transistor having a second transistor first main terminal connected to the first transistor second main terminal, a second transistor second main terminal connected to the gate driver terminal (Vin), and a second transistor control terminal; and a low-pass filter connected between the first transistor control terminal and the gate driver terminal; wherein the second transistor control terminal is configured to be connected to a voltage which is an opposite of the voltage at the gate driver terminal.

The gate voltage may be a low voltage, and the second reference voltage terminal may be configured to be connected to a voltage which is higher than a threshold voltage of the driven transistor (Vth).

In one or more embodiments, the voltage at the gate driver terminal is the low voltage and the control terminal of the second transistor is configured to be connected to the high voltage.

In one or more embodiments, the voltage at the gate driver terminal is the high voltage and the control terminal of the second transistor is configured to be connected to the low voltage, and the second reference voltage is higher than the first reference voltage by a predetermined voltage difference.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
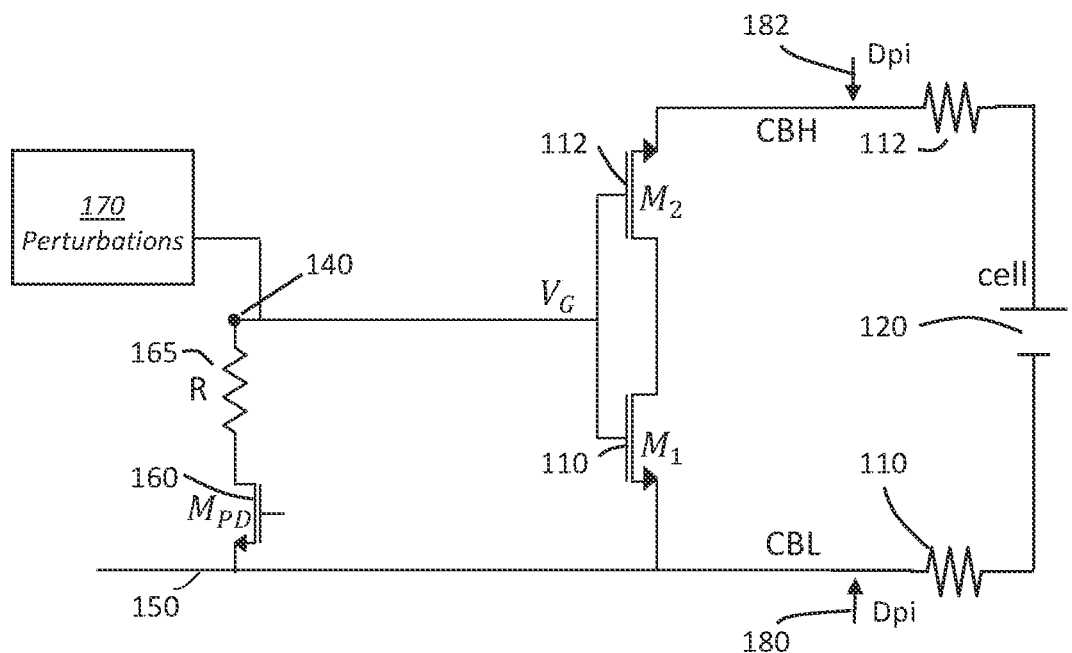
FIG. 1 illustrates a gate driver circuit under noisy conditions.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

Figure 2:
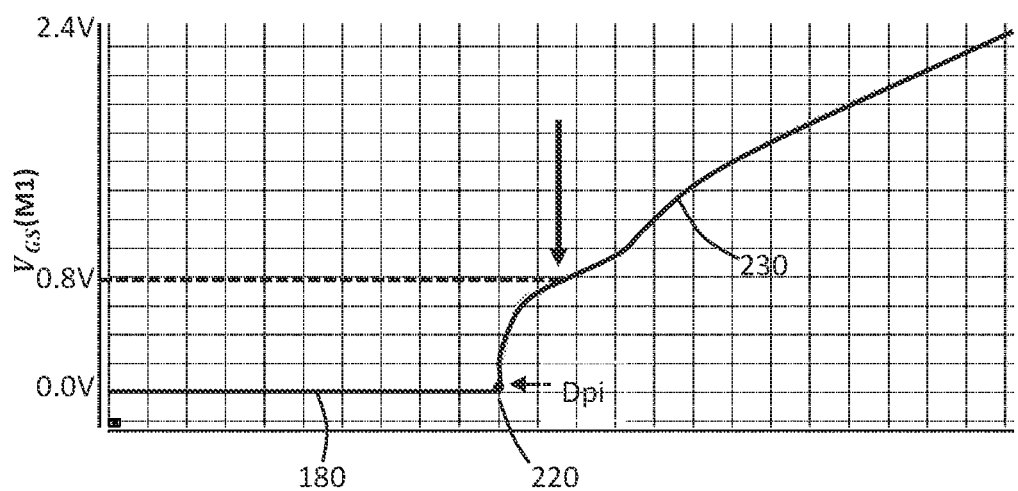
FIG. 2 shows a simulation of operation of the circuit of FIG. 1.

FIG. 1 and FIG. 2 may be useful for understanding problems addressed by the present disclosure. FIG. 1 shows a circuit diagram 100 of a simplified version of a pair of balancing switches 110, 112 across a cell 120, and FIG. 2 shows a corresponding simulation of operation of the circuit under certain test conditions.

The cell shown in FIG. 1 may be one of a series connected stack of cells in a battery stack for instance for providing automobile drive power; however, it may also be used in other applications. Balancing of voltage across the cell 120, relative to the voltage across other cells (not shown) of the stack is effected by driving current through the two balance resistors 130 and 132. This is done by closing switches M1 110 and M2 112, by controlling a common voltage Vg on their gates. The common gate voltage Vg is provided at gate voltage terminal 140.

In a perfect circuit, the common gate voltage may be held either at a reference level 150, such as a ground voltage, or at a relatively high voltage, in dependence on whether a pulldown transistor MPD 160 is on (that is to say, "shut"), or off (that is to say, "open"). The pull-down transistor MPD 160 is connected in series with a resistor R 165 between the lower voltage rail and the gate voltage terminal 140. The resistor R may typically have a value of 60 kOhm.

However, in some real-world applications, noise or perturbations, and in particular, electromagnetic interference (EMI), shown schematically in FIG. 1 by the box 170 labelled "perturbations", can be problematic. In particular, in some situations, the noise can result in charge accumulating at the gate driver terminal. This may occur, for example, in applications in which the gate driver control circuitry includes a block such as an amplifier which has bandwidth limitations unable to respond to high frequency components of the noise or EMI. This may result in the noise being "rectified", in which case integration over time may result in an imbalance of charge creating a DC shift of the voltage at the gate voltage terminal 140.

This effect may be simulated by the insertion of noise into the circuit, as shown in FIG. 1 at 180 and 182 "DPI". The skilled person will be familiar that the effect of noise may be simulated by direct power injection (DPI) as shown.

The result of such a simulation of noise injection through DPI is shown in FIG. 2. FIG. 2 shows the gate source voltage across the switch M1 110, measured against time. Initially, as shown on the left-hand side of the figure at 210, the gate voltage terminal 140 is tied to the reference level 150, with an offset difference corresponding to the gate source voltage, Vgs, across M1. At the moment shown by the lower arrow 220, noise is started to be introduced by DPI, and as shown the gate source voltage across M1 starts to climb. Within about 7 ms in this example, Vgs has reached the threshold voltage of M1, of about 800 mV, and as a consequence M1 turns on. In the simulation, Vgs may continue to climb resulting in M1 being fully conducting. A similar effect may also switch on M2, which would result in unwanted cell voltage balancing. In other applications the consequences of M1 unintentionally being switched on may be even more undesirable.

Figure 3:
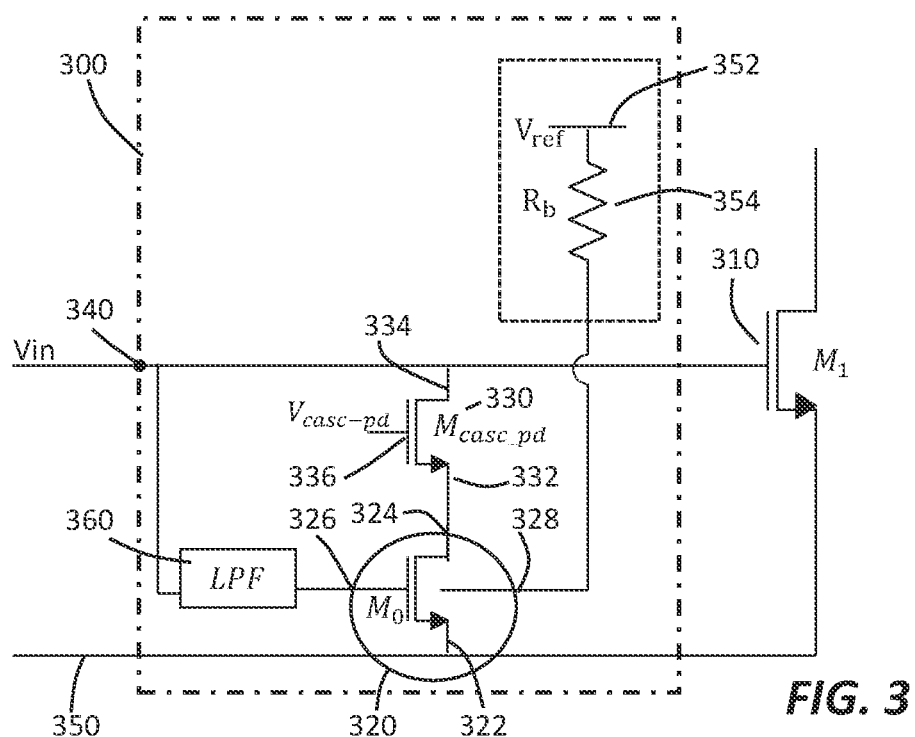
FIG. 3 shows an example of a stabilizer circuit 300 for stabilizing a voltage at a gate driver terminal, according to one or more embodiments.

FIG. 3 shows an example of a stabilizer circuit 300 for stabilizing a voltage at a gate driver terminal 340 according to one or more embodiments of the present disclosure. This circuit acts as a stabilizer in "pull-down" conditions. As shown the circuit includes a pair of series-connected or "cascaded" transistors, which are configured to react to the noise or perturbations prior to the gate of driven transistor M1, 310 reaching the threshold voltage of M1.

The pair of series connected transistors comprises a first transistor M0 320, having a first transistor first main terminal 322, which may be a source terminal as shown, connected to a reference voltage terminal 350 which may be a local ground, a first transistor second main terminal 324, which may be a drain terminal as shown, a first transistor control terminal 326, and a body terminal 328 connected to a second reference voltage Vref 352, through a biasing resistor Rb 354. The pair of series-connected transistors further comprises a second transistor Mcasc_pd 330 having a second transistor first main terminal 332, which may be a source terminal as shown, connected to the first transistor second main terminal, a second transistor second main terminal 334, which may be a drain terminal as shown and is connected to the gate driver terminal 340, and a second transistor control terminal 336.

The second transistor control terminal is configured to be connected to a voltage Vcasc_pd which is the inverse, or opposite, of the voltage Vin on the gate voltage terminal, in the sense that if Vin is high then Vcasc_pd, is low, and vice versa. In the present context, the statement "Vin is high", means that Vin has a sufficiently high voltage, referenced against the first reference voltage or ground at terminal 350, to ensure that the switch M1 310 is turned on. In practical examples a high value for Vin may typically correspond to a voltage in a range between 2 and 8V, and more particularly between 4.5 and 5.5V, or 5V. In other examples it may correspond to another voltage. When Vin is high as defined, Vcasc_pd is low (having a voltage of approximately 0 V referenced against the reference voltage or ground at terminal 350). Conversely, when Vin is low (having a voltage of approximately 0 V referenced against the reference voltage or ground at terminal 350), Vcasc_pd high (and thus typically may have a voltage in a range between 2 and 8V and more particularly between 4.5 and 5.5V, or 5V). The voltage Vcasc_pd may be generated, independently from the voltage Vin at the gate voltage terminal 340, by any appropriate circuit and typically has its own drive.

The control terminal of the first transistor is connected to the gate driver terminal 340 by a low-pass filter 360. The low-pass filter is provided to ensure that it is the DC value of the voltage Vg on at the gate driver terminal which controls the operation of the transistor M0, so that, for instance, it is not unintentionally switched on or off by a single fast transient which may exist within the noise or EMI signal. In the present context, "low pass" is defined relative to a typical operational speed of the circuit, and thus the low-pass filter may for instance have a cut-off frequency which is 5 times, or one decade or more slower than the design frequency for the gate driver circuit as a whole. For example, in the case that the circuit is intended to operate at frequencies around 10 MHz, the low-pass filter may have a cut-off frequency which 1 MHz or less.

In operation, when Vin is low, the voltage Vb at the body terminal is higher than the voltage, Vin, at the gate driver terminal. The voltage Vb is related to the second reference voltage Vref at the second voltage reference terminal, by the current through the biasing resistor Rb 354, which current is the same as the body current in the first transistor M0. Typically, the body current is small, so the body terminal voltage Vb is close to the second reference voltage Vref. As a result, the bulk of transistor M0 is biased to a relatively high voltage which depresses its threshold voltage Vth_M0 below the threshold voltage of M1. The threshold voltage of M1 may be designated Vth_M1. In consequence, if perturbations or EMI at the gate driver terminal start to increase the voltage Vin at the gate driver terminal, the gate of M0 reaches its threshold voltage, Vth_M0, before the gate of the main switch M1 310 can reach its threshold voltage, Vth_M1. The effect of this is that M0 turns on before M1 would start to turn on. And Mcass_pd is already on, since its gate voltage, Vcasc_pd, is high. As a result, the gate driver terminal is electrically connected to the first reference voltage 350 through the second transistor Mcasc_pd and the first transistor M0, which discharges any charge at the terminal and ensures that Vin is tied "low". Although FIG. 3 shows a pull-down circuit, the skilled person will appreciate that a similar or corresponding circuit may be used to tie the gate voltage to a "high" reference voltage to operate as a pull-up circuit, when Vin is "high", rather than "low".

Figure 4:
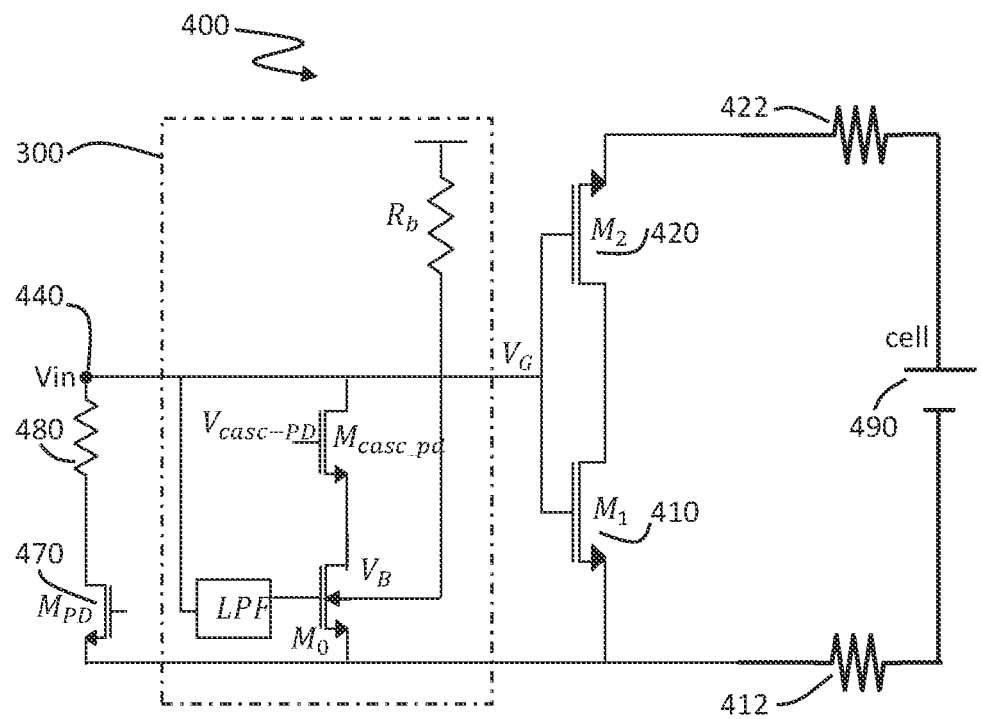
FIG. 4 illustrates a gate driver circuit, including a stabiliser circuit shown FIG. 3 under noisy conditions.
Figure 5:
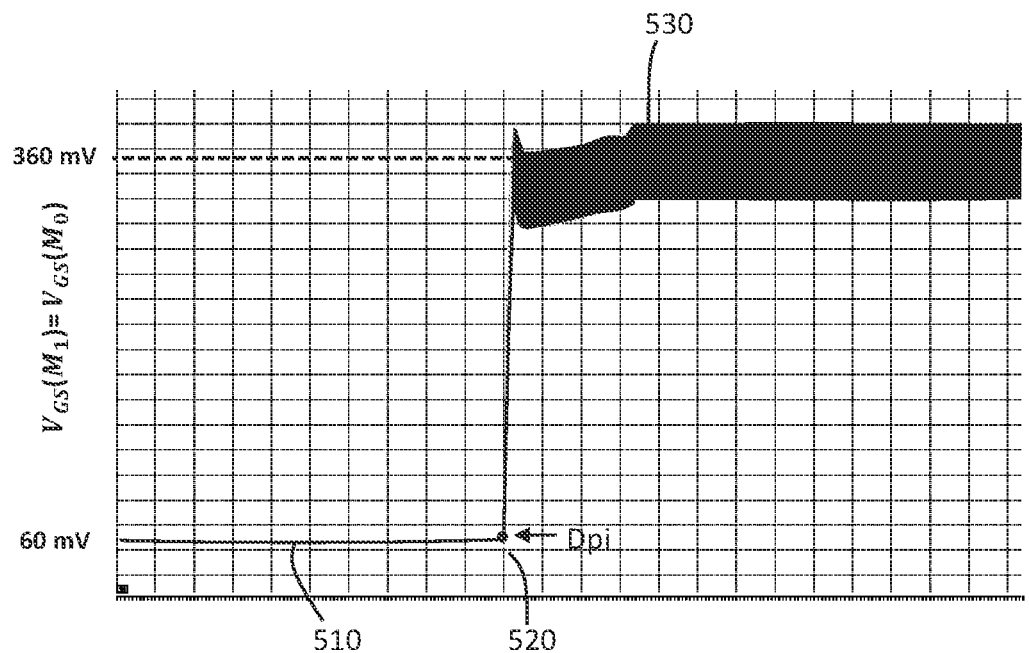
FIG. 5 shows a simulation of operation of the circuit of FIG. 4.

Turing now to FIGS. 4 and 5, these show a typical application of a stabiliser circuit—in this case for pull down operation, according to the present disclosure. FIG. 4 shows a simplified test circuit for a stabiliser circuit 300 as described above, used in a gate driver circuit which also includes a conventional pulldown transistor 470 connected to the gate driver terminal Vin 440 through a resistor 480. Gate driver terminal 440 is connected, at voltage Vg to the gate of each of a pair of balancing transistors M1 410 and M2 420, which may be used in applications such as battery management, and in the example shown are provided, connected in series across a cell 490 through balancing resistor is 412 and 422.

FIG. 5 shows operation of the circuit under conditions where noise is introduced through DPI as discussed above. In particular the gate-source voltage Vgs across M1 is plotted against time. Since Vin is intentionally low, initially Vgs is very low, as shown at 510. On the introduction of simulated noise through insertion of DPI at moment 520 Vgs starts to rise, but as can be seen in the figure the rise is limited, as shown at 530, to around 370 mV, which is significantly below its threshold voltage and then thus M1 remains in an-off, because of the operation of the stabiliser circuit.

Figure 6:
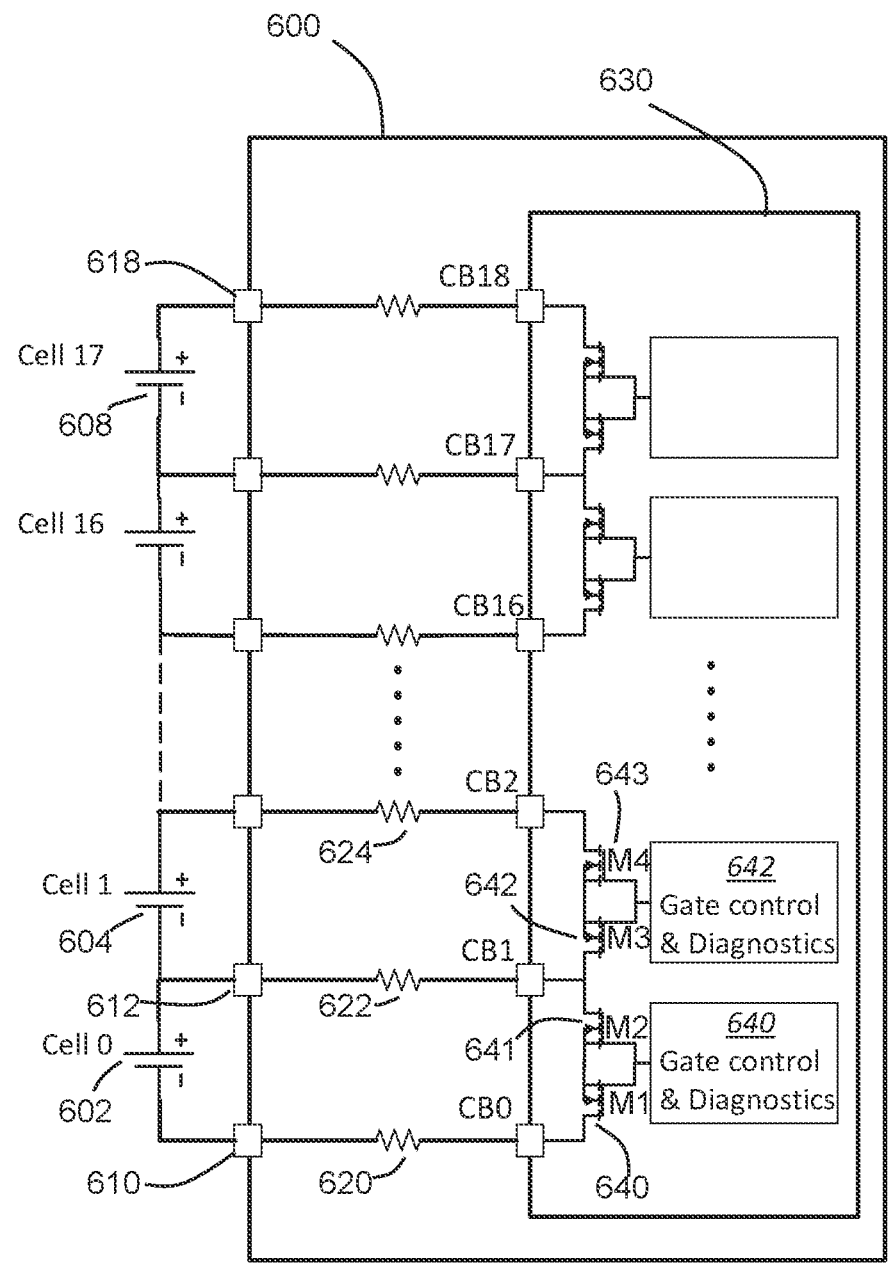
FIG. 6 shows, schematically, an example application of a stabiliser circuit according to one or more embodiments.

Turning now to FIG. 6, this depicts an example application in which a stabiliser circuit according to one or maybe embodiments may be used to advantage. The skilled person will appreciate that bulletin the present invention may be used in other applications and the present disclosure is not limited to battery management applications such as that shown in FIG. 6, but extends to other applications in which a control terminal of a switch is subject to a noisy environment for which clamping or pull-down may be desirable. The application depicted in FIG. 6 is a part of multi-cell battery management system and in particular shows, schematically, circuitry 600 for balancing the state of charge of a plurality of cells (cell0 602, cell1 604, through cell17 608 in a battery stack).

In the battery stack, the cells are connected in series, and the control circuitry includes input terminals 612, 614 for connection to each intercell node, that is to each of the nodes between neighbouring pairs of cells of the battery stack, along with bottom and top input terminals 610 and 618 connection to the bottom and top of the battery stack respectively. The circuitry includes resistors 620, 622, etc. connecting each of the intercell node terminals 610, 612, etc. to a corresponding terminal (CB0, CB1, etc.) of a control circuit 630. Control circuit 613 may be implemented for instance as a control IC. The control circuit includes a pair of balancing transistors between each neighbouring terminal. For instance, a pair of transistors M1 640 and M2 641 are connected in series between the terminal CB0 and CB1; similarly, a pair of transistors M3 642 and M4 643 are connected in series between terminals CB1 and CB2, and so on. M1 may correspond to the balancing transistor depicted in FIG. 3 or the balancing transistor 410 depicted in FIG. 4. Similarly, M2 may correspond to the balancing transistor 420 depicted in FIG. 4. Moreover resistors 620 and 622 may correspond to the balancing resistors 412 and 422 depicted in FIG. 4. Balancing transistors M1 and M2 are controlled by gate drive control and diagnostics 650, balancing transistors M3 and M4 are controlled by gate driver control diagnostics 652, and so on for each transistor pair between each terminal CBn.

In operation, the gate driver control diagnostics 650, 652 etc. are used to measure the voltage across terminals CB0 and CB1, CB1 and CB2, etc, and in the event of determining different voltages, which may for instance be indicative of different states of charge of the cells in the battery stack, to selectively close neighbouring pairs of transistors (M1 and M2, or M3 and M4, for example), typically for relatively short periods of time, in order to partially discharge the relevant cell through the relevant pair of balancing resistors (620 and 622, or 622 and 624, for example). It will be appreciated that embodiments of the disclosure, and in particular example such as that shown in FIG. 3, may be beneficially applied in order to prevent undesirable and unintentional opening or closing of one or more of the switches M1 or M2 which could otherwise occur, particularly so in noisy environments such as operation of an automobile.

From reading the present disclosure, other variations and modifications will be apparent to the skilled person. Such variations and modifications may involve equivalent and other features which are already known in the art of clamping or stabilizer circuits, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

It is noted that one or more embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, a single processor or other unit may fulfil the functions of several means recited in the claims [delete if not relevant] and reference signs in the claims shall not be construed as limiting the scope of the claims. Furthermore, the word "may" is used in a permissive sense (i.e., meaning having the potential to), rather than the mandatory sense (i.e., meaning must). Similarly, the words "include," "including," and "includes" mean including, but not limited to.

LIST OF REFERENCE SIGNS 110, 112 balancing switch
120 cell
130,132 balance resistor
140 gate voltage terminal
150 ground reference level
160 pulldown transistor MPD
165 resistor R
170 Perturbations
180,182 direct power injection
210 initial gate voltage
220 noise introduction
300 stabilizer circuit
310 driven transistor
320 first transistor M0
322 first transistor first main terminal
324 first transistor second main terminal
326 first transistor control terminal
328 body terminal
330 second transistor
332 second transistor first main terminal
334 second transistor second main terminal
336 second transistor control terminal
340 gate driver terminal
350 reference voltage terminal
352 second reference voltage terminal
354 biasing resistor
360 low pass filter
400 test circuit
410,420 balancing transistor
412,422 balancing resistor
440 gate driver terminal
470 pulldown transistor
480 pulldown transistor biasing resistor
490 cell
510 initial value for M1_Vgs
520 insertion of DPI
530 clamped value of M1_Vgs
600 cell balancing circuit
602, 604,606 cell
610 bottom input terminal
612, 614 intercell node terminal
618 bottom top input terminal
620, 622, 624 resistor
630 control circuit
640, 641 balancing transistors
642, 643 balancing transistors
650, 652 gate drive control and diagnostics

The invention claimed is:

1. A stabilizer circuit, for stabilizing a voltage at a gate driver terminal of a gate-driver for a driven transistor to a one of a high voltage and a low voltage, the stabilizer circuit comprising:
a first transistor and a second transistor having respective first and second main terminals and connected in series between the gate voltage terminal and a first reference voltage terminal; and
a low-pass filter connected between a control terminal of the first transistor and the gate driver terminal;
wherein the first transistor is configured to have a threshold voltage which is less than a threshold voltage of the driven transistor; and
the second transistor has a control terminal which is configured to be connected to a voltage which is an oppositive of the voltage at the gate driver terminal.

2. The stabilizer circuit of claim 1, wherein:
the first transistor has a first transistor first main terminal connected to a reference voltage terminal, and a first transistor second main terminal; and
the second transistor has a second transistor first main terminal connected to the first transistor second main terminal, and a second transistor second main terminal connected to the gate driver.

3. The stabilizer circuit of claim 2, wherein the first transistor has a body contact configured to be connected to a second reference voltage through a biasing resistor such that the threshold voltage of the first transistor is less than a threshold voltage of the driven transistor.

4. The stabilizer circuit of claim 2, wherein the first transistor is an NMOS transistor.

5. The stabilizer circuit of claim 2, wherein the second transistor is an NMOS transistor.

6. The stabilizer circuit of claim 2, wherein the first transistor has a gate width to gate length ratio of at least 25.

7. The stabilizer circuit of claim 2, wherein first reference voltage and the biasing resistor are configured such that a voltage difference between the first transistor body terminal and the first transistor first main terminal is in a range between 0.5 V and 1.5V.

8. The stabilizer circuit of claim 2, wherein the low-pass filter has a cut-off frequency which is no more than one-fifth of an operational frequency of the gate-driver.

9. The stabilizer circuit of claim 1, wherein the first transistor has a body contact configured to be connected to a second reference voltage through a biasing resistor such that the threshold voltage of the first transistor is less than a threshold voltage of the driven transistor.

10. The stabilizer circuit of claim 9, wherein the high voltage is in a range between 3 V and 7V, and the low voltage is a ground voltage.

11. The stabilizer circuit of claim 10, wherein the voltage at the gate driver terminal is the low voltage and the control terminal of the second transistor is configured to be connected to the high voltage.

12. The stabilizer circuit of claim 9, wherein the voltage at the gate driver terminal is the low voltage and the control terminal of the second transistor is configured to be connected to the high voltage.

13. The stabilizer circuit of claim 12, wherein the second reference voltage is higher than a threshold voltage of the driven transistor (Vth).

14. The stabilizer circuit of claim 1, wherein the first transistor is an NMOS transistor.

15. The stabilizer circuit of claim 1, wherein the second transistor is an NMOS transistor.

16. The stabilizer circuit of claim 1, wherein the first transistor has a gate width to gate length ratio of at least 25.

17. The stabilizer circuit of claim 1, wherein first reference voltage and the biasing resistor are configured such that a voltage difference between the first transistor body terminal and the first transistor first main terminal is in a range between 0.5 V and 1.5V.

18. The stabilizer circuit of claim 1, wherein the low-pass filter has a cut-off frequency which is no more than one-fifth of an operational frequency of the gate-driver.

* * * * *